(12) United States Patent
Pohl et al.

(10) Patent No.: US 8,334,202 B2
(45) Date of Patent: Dec. 18, 2012

(54) DEVICE FABRICATED USING AN ELECTROPLATING PROCESS

(75) Inventors: Jens Pohl, Bernhardswald (DE); Hans-Joachim Barth, Munich (DE); Gottfried Beer, Nittendorf (DE); Rainer Steiner, Regensburg (DE); Werner Robl, Regensburg (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 517 days.

(21) Appl. No.: 12/611,609

(22) Filed: Nov. 3, 2009

(65) Prior Publication Data

US 2011/0101532 A1    May 5, 2011

(51) Int. Cl.
*H01L 23/48* (2006.01)
(52) U.S. Cl. .. 438/622; 438/623; 438/625; 257/E23.011
(58) Field of Classification Search .......... 438/622–625; 257/758, 760, 762, 765, 768, E23.011, E23.012
See application file for complete search history.

(56) References Cited

U.S. PATENT DOCUMENTS

| | | | |
|---|---|---|---|
| 6,605,534 B1 | 8/2003 | Chung et al. | |
| 6,759,330 B2 | 7/2004 | Chopra et al. | |
| 6,905,914 B1 | 6/2005 | Huemoeller et al. | |
| 7,247,523 B1 | 7/2007 | Huemoeller et al. | |
| 7,262,505 B2 | 8/2007 | Ahn et al. | |
| 7,517,444 B2 | 4/2009 | Basol | |
| 2002/0081838 A1 | 6/2002 | Bohr | |
| 2002/0197806 A1 | 12/2002 | Furukawa et al. | |
| 2005/0196951 A1 | 9/2005 | Lin et al. | |
| 2006/0009026 A1 | 1/2006 | Sawaguchi et al. | |
| 2006/0258144 A1 | 11/2006 | Choi et al. | |
| 2006/0292851 A1* | 12/2006 | Lin et al. ....................... | 438/618 |
| 2008/0057709 A1 | 3/2008 | Vasilev | |
| 2008/0131996 A1 | 6/2008 | Wu | |
| 2009/0072411 A1 | 3/2009 | Tews et al. | |

FOREIGN PATENT DOCUMENTS

DE    102008025223    12/2008

* cited by examiner

*Primary Examiner* — Zandra Smith
*Assistant Examiner* — Paul Patton
(74) *Attorney, Agent, or Firm* — Dicke, Billig & Czaja, PLLC

(57) ABSTRACT

A method for fabricating a device includes providing a substrate including at least one contact and applying a dielectric layer over the substrate. The method includes applying a first seed layer over the dielectric layer, applying an inert layer over the seed layer, and structuring the inert layer, the first seed layer, and the dielectric layer to expose at least a portion of the contact. The method includes applying a second seed layer over exposed portions of the structured dielectric layer and the contact such that the second seed layer makes electrical contact with the structured first seed layer. The method includes electroplating a metal on the second seed layer.

16 Claims, 13 Drawing Sheets

DEVICE FABRICATED USING AN ELECTROPLATING PROCESS

BACKGROUND

A typical damascene process for fabricating metal traces and via contacts in organic dielectric materials includes a number of steps. First, trenches and contact holes are formed in a dielectric material. Second, the trenches and contact holes are then metallized with a seed layer and subsequently filled with a metal using an electroplating process. To achieve complete filling of the trenches and contact holes, an overplating process is used (i.e., the metal is electroplated to a larger thickness than the desired thickness). Third, the electroplated metal is backetched to expose the traces and via contacts.

The typical electroplating process is designed such that more metal is deposited in the trenches than on the top surface of the dielectric material. The excessive metal deposited on top of the dielectric material is called an overburden. In the typical electroplating process, the overburden must be removed to expose the traces and via contacts.

The typical damascene process as described above has several disadvantages. One disadvantage of the typical damascene process is the slow deposition rate. The deposition rate is much slower than for the standard plating speed due to the plating and etching combination to avoid too large of an overburden on the top surface of the dielectric material. This results in a high process cost, especially when single wafer plating equipment is utilized.

Another disadvantage of the typical damascene process is the requirement for a very well-defined backetch process. For the backetch process, a very uniform overburden and a well-controlled backetch is mandatory. Such a well-defined backetch process is difficult to achieve.

For these and other reasons, there is a need for the present invention.

SUMMARY

One embodiment provides a method for fabricating a device. The method includes providing a substrate including at least one contact and applying a dielectric layer over the substrate. The method includes applying a first seed layer over the dielectric layer, applying an inert layer over the seed layer, and structuring the inert layer, the first seed layer, and the dielectric layer to expose at least a portion of the contact. The method includes applying a second seed layer over exposed portions of the structured dielectric layer and the contact such that the second seed layer makes electrical contact with the structured first seed layer. The method includes electroplating a metal on the second seed layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
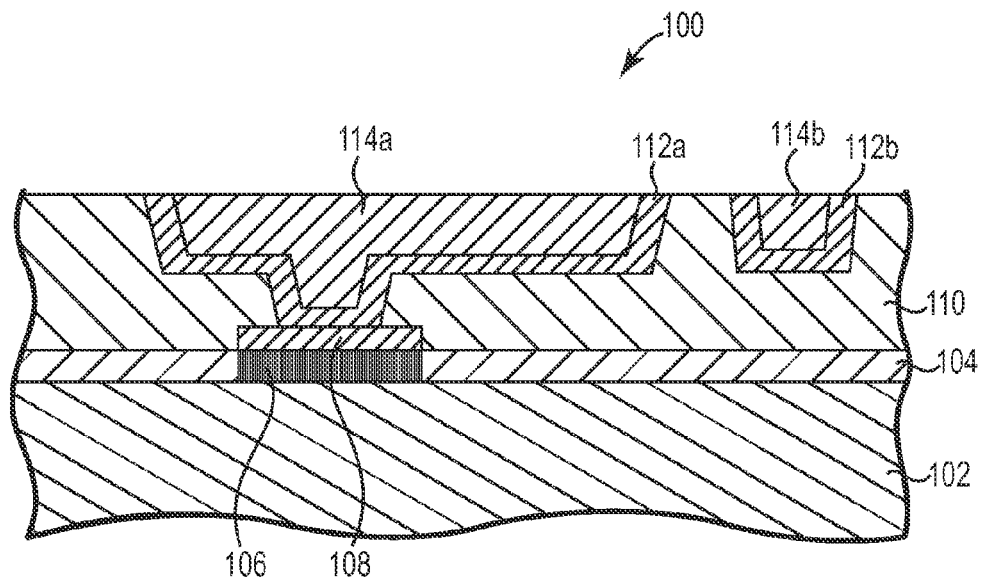
FIG. 1 illustrates a cross-sectional view of one embodiment of a semiconductor device after a damascene plating process.

FIG. 1 illustrates a cross-sectional view of one embodiment of a semiconductor device 100 after a damascene plating process. Semiconductor device 100 includes a semiconductor chip or die 102, a dielectric layer 104, chip terminal 106, pad metal 108, dielectric material 110, seed layer 112a and 112b (collectively referred to as seed layer 112), and metal layer 114a and 114b (collectively referred to as metal layer 114).

Metal layer 114 of semiconductor device 100 provides a redistribution layer (RDL) for the semiconductor device. Metal layer 114 is fabricated using a damascene plating process where the metal layer is not backetched. By using a damascene plating process, photolithography steps for fabricating the RDL layer are eliminated. In addition, by using a damascene plating process, fine structures such as lines smaller than 10 μm and spaces smaller than 10 μm can be fabricated. Further, the mechanical stability of damascene plated features 114a and 114b is improved due to metal layer 114 being embedded in dielectric material 110.

The top of semiconductor die 102 contacts the bottom of chip terminal 106 and the bottom of dielectric layer 104. Dielectric layer 104 laterally surrounds and/or overlaps the edge of chip terminal 106. Pad metal 108 may also overlap dielectric layer 104. Dielectric layer 104 includes $SiO_2$, SiN, or other suitable dielectric material. The top of chip terminal 106 contacts the bottom of pad metal 108. Pad metal 108 includes Cu, Al, or another suitable contact material. Pad metal 108 is electrically coupled to die 102. If the contact material and the contact thickness of chip terminal 106 are already suited for the later damascene process, the application of an additional pad metal 108 can be omitted.

A portion of the bottom of seed layer 112a contacts pad metal 108. Seed layer 112 includes palladium (Pd), copper (Cu), or other suitable seed material for an electroplating process. Seed layer 112 contacts the bottom and laterally surrounds metal layer 114. Metal layer 114 includes Cu or another suitable metal. Seed layer 112 and metal layer 114 are embedded in dielectric material 110. Dielectric material 110 includes an Ajinemoto Build-up Film (ABF) or other suitable dielectric material.

The following FIGS. 2-9 illustrate embodiments for fabricating semiconductor device 100 using a damascene plating process.

Figure 2:
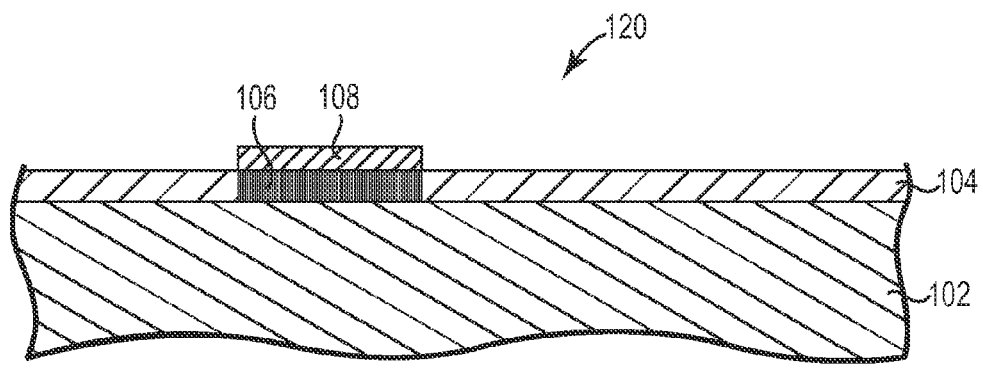
FIG. 2 illustrates a cross-sectional view of one embodiment of a preprocessed structure.

FIG. 2 illustrates a cross-sectional view of one embodiment of a preprocessed structure 120. Preprocessed structure 120 includes a semiconductor die 102, a dielectric layer 104, chip terminal 106, and pad metal 108 as previously described and illustrated with reference to FIG. 1. In one embodiment, preprocessed structure 120 is part of an embedded wafer level ball grid array (eWLB) wafer prior to fabrication of the RDL. In another embodiment, preprocessed structure 120 is part of a laminate substrate with embedded dies prior to fabrication of the RDL.

Figure 3:
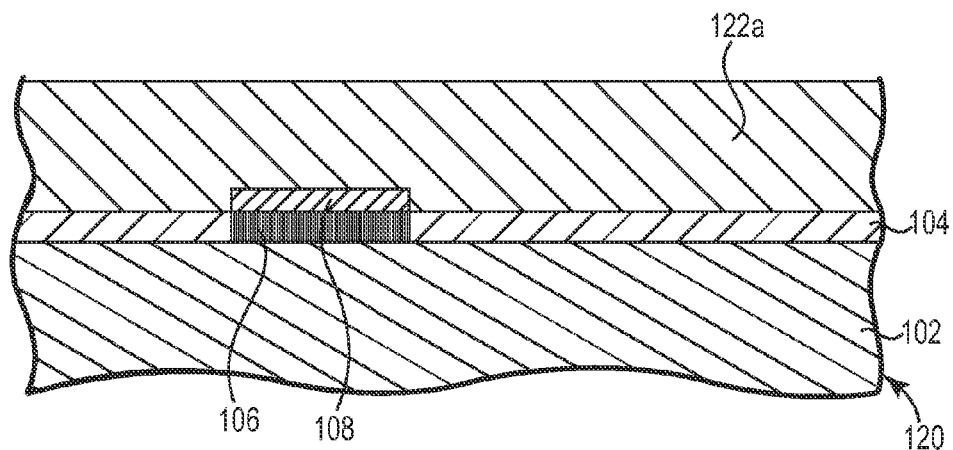
FIG. 3 illustrates a cross-sectional view of one embodiment of the preprocessed structure and a dielectric material layer.

FIG. 3 illustrates a cross-sectional view of one embodiment of preprocessed structure 120 and a dielectric material layer 122a. A dielectric material, such as Ajinemoto Build-up Film (ABF) or other suitable dielectric material is applied over preprocessed structure 120 to provide dielectric material layer 122a. In one embodiment, dielectric material layer 122a is selected to be suitable for laser ablation. In one embodiment, dielectric material layer 122a is applied in sheet form. In another embodiment, dielectric material layer 122a is applied using spin-on, spray-on, curtain coating, or other suitable deposition technique. Dielectric material layer 122a is applied to a thickness suitable for embedding metal traces and via contacts within the dielectric material layer.

Figure 4:
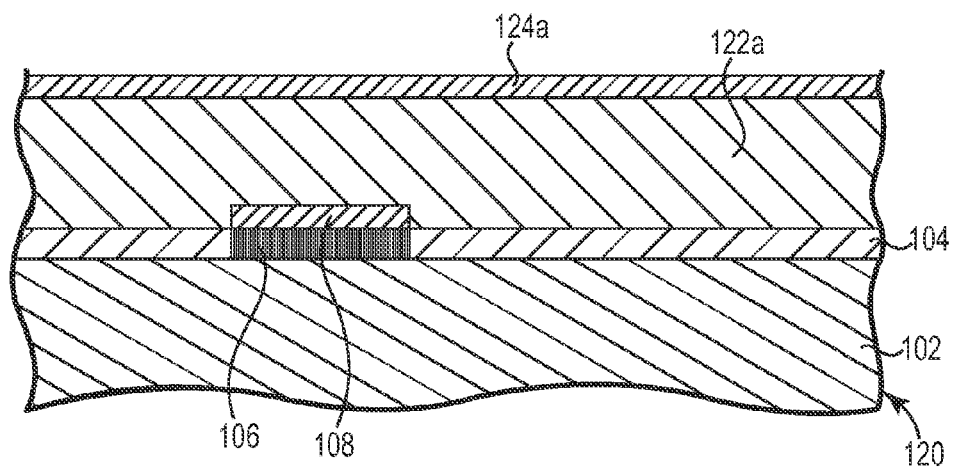
FIG. 4 illustrates a cross-sectional view of one embodiment of the preprocessed structure, the dielectric material layer, and a first seed layer.

FIG. 4 illustrates a cross-sectional view of one embodiment of preprocessed structure 120, dielectric material layer 122a, and a first seed layer 124a. A metallic material, such as Cu or other suitable metallic material is applied over dielectric material layer 122a to provide first seed layer 124a. In one embodiment, first seed layer 124a is selected to be suitable for laser ablation. In one embodiment, first seed layer 124a is applied in sheet form, which could be present on the dielectric sheet material prior to applying dielectric material layer 122a. In another embodiment, first seed layer 124a is applied to dielectric material layer 122a by sputtering, vapor deposition, or other suitable deposition technique. In one embodiment, first seed layer 124a is applied to a thickness between approximately 100 nm and 3 μm. The thickness of first seed layer 124a is selected to provide a sufficient electrical current flow for the electroplating process performed later in the fabrication process. In one embodiment, the surface of first seed layer 124a is very smooth with a small surface roughness.

Figure 5:
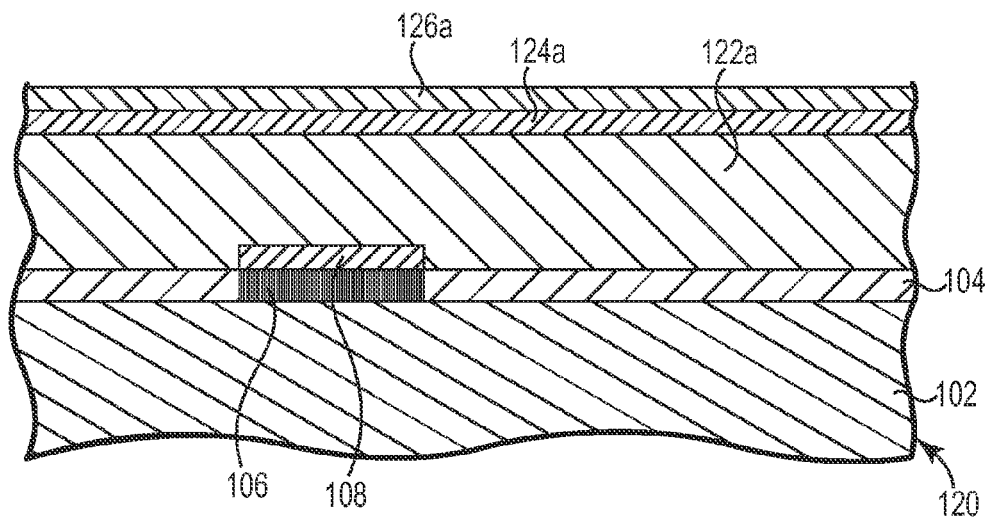
FIG. 5 illustrates a cross-sectional view of one embodiment of the preprocessed structure, the dielectric material layer, the first seed layer, and an inert layer.

FIG. 5 illustrates a cross-sectional view of one embodiment of preprocessed structure 120, dielectric material layer 122a, first seed layer 124a, and an inert layer 126a. A chemically inert material, such as polytetrafluoroethylene (PTFE), polyvinylidene fluoride (PVDF), polyaryletheretherketone (PEEK), perfluoroalkoxy polymer (PFA), parylene, highly crystalline polyethylene, highly crystalline polypropylene, or other suitable chemically inert material is applied over first seed layer 124a to provide inert layer 126a. In one embodiment, inert layer 126a is applied in sheet form, which could be present on the first seed layer 124a, which could be present on the dielectric sheet material prior to applying dielectric material layer 122a. In another embodiment, inert layer 126a is applied to first seed layer 124a by a plasma process, spin-on, spray-on, or other suitable deposition technique.

In one embodiment, inert layer 126a is selected to be suitable for laser ablation and to withstand the electroplating process performed later in the fabrication process. Inert layer 126a is selected to withstand a chemical treatment used to create a chemical seed layer. In addition, inert layer 126a is selected such that the inert layer will not be seeded with metal or metal colloids during the electroplating process.

In one embodiment, due to the smooth surface and small surface roughness of first seed layer 124a, inert layer 126a also has a smooth surface. The smooth surface of inert layer 126a prevents chemical seed deposition on the inert layer later in the fabrication process. In one embodiment, inert layer 126a is applied to a thickness less than 1 µm, such as between 10 nm and 500 nm. The thickness of inert layer 126a is selected such that the inert layer can be ablated by laser radiation or can be removed by other suitable methods such as etching, plasma etching, or polishing.

Figure 6:
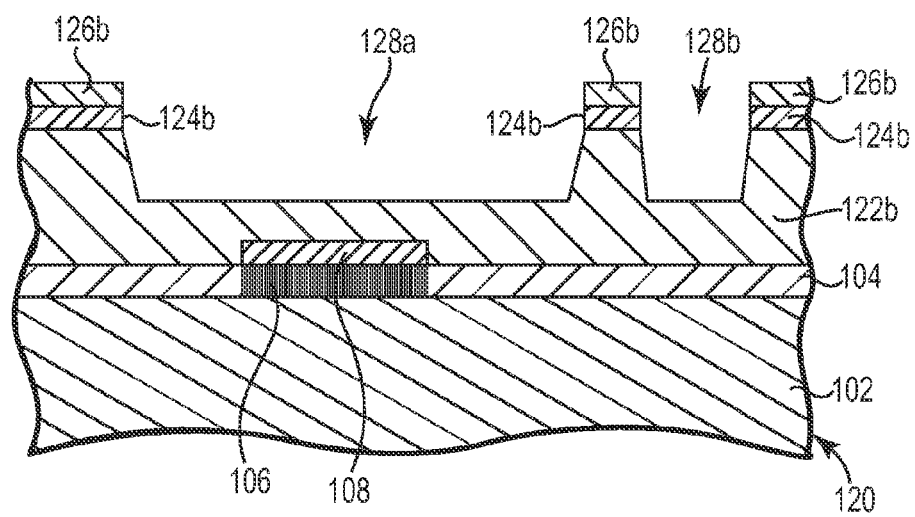
FIG. 6 illustrates a cross-sectional view of one embodiment of the preprocessed structure, the dielectric material layer, the first seed layer, and the inert layer after a first laser ablation process.

FIG. 6 illustrates a cross-sectional view of one embodiment of preprocessed structure 120, dielectric material layer 122b, first seed layer 124b, and inert layer 126b after a first laser ablation process. Trace shapes 128a and 128b are formed through inert layer 126a and first seed layer 124a and into dielectric material layer 122a by laser ablation using a first mask or pattern to provide dielectric material layer 122b, first seed layer 124b, and inert layer 126b. For the ablation process, a laser having a suitable wavelength, pulse length, and power is selected based on the materials used for dielectric material layer 122a, first seed layer 124a, and inert layer 126a.

Figure 7:
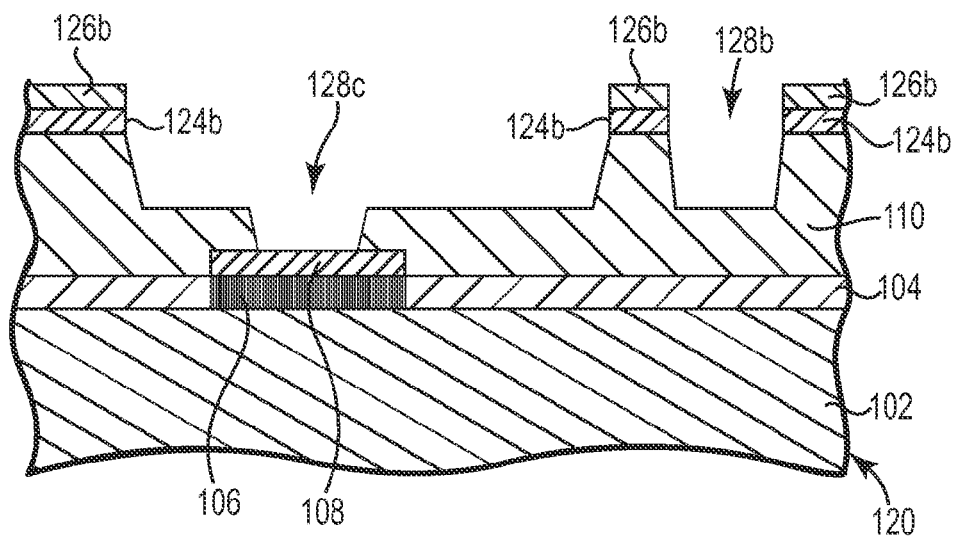
FIG. 7 illustrates a cross-sectional view of one embodiment of the preprocessed structure, the dielectric material layer, the first seed layer, and the inert layer after a second laser ablation process.

FIG. 7 illustrates a cross-sectional view of one embodiment of preprocessed structure 120, dielectric material layer 110, first seed layer 124b, and inert layer 126b after a second laser ablation process. Via shapes 128c are formed into dielectric material layer 122b by laser ablation using a second mask or pattern to provide dielectric material layer 110 exposing at least a portion of pad metal 108.

In one embodiment, if chip terminal 106 and pad metal 108 are sufficiently thick (e.g., the chip terminal 106 provides a copper pillar), the ablation of via structure 128c may be omitted. In this case, the traces 128a and 128b are ablated to a depth that exposes the top surface of pad metal 108. Thus, the additional laser ablation step to form via shapes 128c is eliminated.

Figure 8:
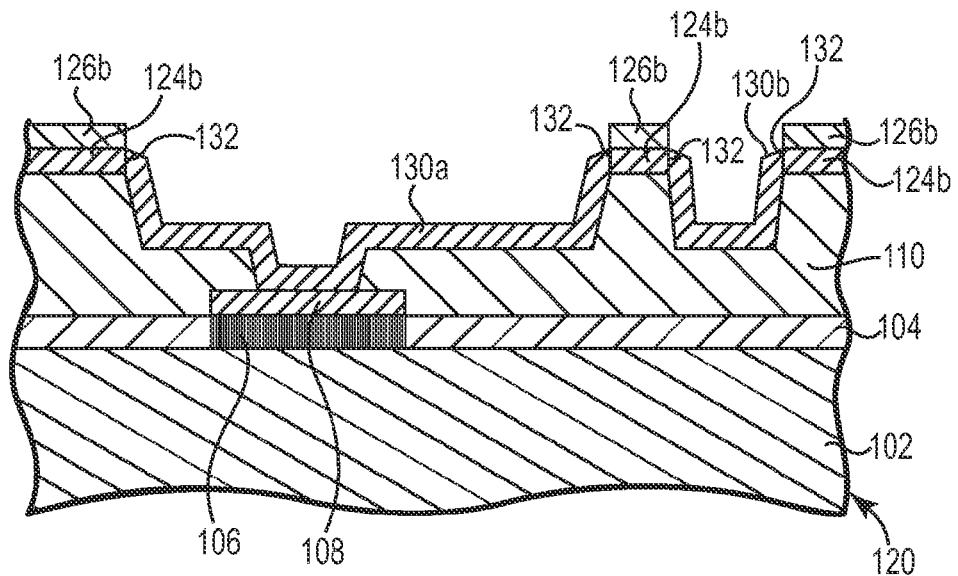
FIG. 8 illustrates a cross-sectional view of one embodiment of the preprocessed structure, the dielectric material layer, the first seed layer, the inert layer, and a second seed layer.

FIG. 8 illustrates a cross-sectional view of one embodiment of preprocessed structure 120, dielectric material layer 110, first seed layer 124b, inert layer 126b, and a second seed layer 130a and 130b (collectively referred to as second seed layer 130). A palladium (Pd) based or other suitable material is chemically applied over exposed portions of dielectric material layer 110 and pad metal 108 to provide second seed layer 130. In one embodiment, the seed layer includes an additional electroless Cu deposition over the Pd to provide second seed layer 130. Second seed layer 130 makes electrical contact to first seed layer 124b at points 132. In this way, a continuous electrically conductive layer including second seed layer 130 and first seed layer 124b is formed. Where inert layer 126b covers first seed layer 124b and dielectric material layer 110, there is no deposition of second seed layer 130. Second seed layer 130a contacts pad metal 108.

Figure 9:
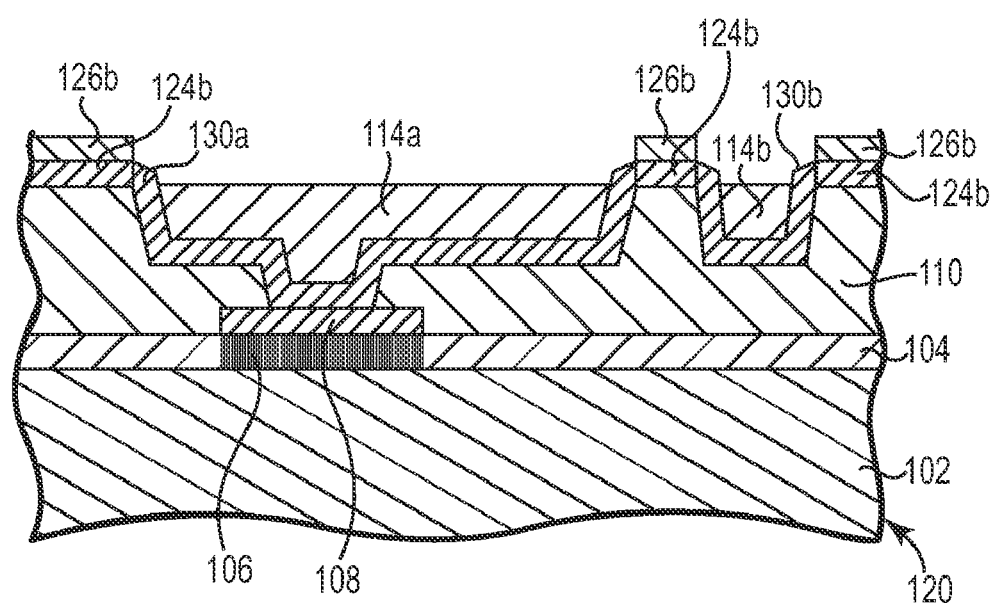
FIG. 9 illustrates a cross-sectional view of one embodiment of the preprocessed structure, the dielectric material layer, the first seed layer, the inert layer, the second seed layer, and a metal layer.

FIG. 9 illustrates a cross-sectional view of one embodiment of preprocessed structure 120, dielectric material layer 110, first seed layer 124b, inert layer 126b, second seed layer 130, and metal layer 114a and 114b (collectively referred to as metal layer 114). An electroplating process is used to fill the trace and via structures with Cu or other suitable metal to provide metal layer 114. Where inert layer 126b covers first seed layer 124b and dielectric material layer 110, there is no deposition of metal layer 114. This plating process is much faster than the typical damascene plating process since this process fills the trace and via structures without overplating and eliminates the difficulty to control backetch process.

Inert layer 126b, first seed layer 124b, and a portion of second seed layer 130a and 130b are then removed by etching, plasma-etching, laser ablation, polishing, or other suitable technique to provide seed layer 112a and 112b and semiconductor device 100 previously described and illustrated with reference to FIG. 1.

Figure 10A:
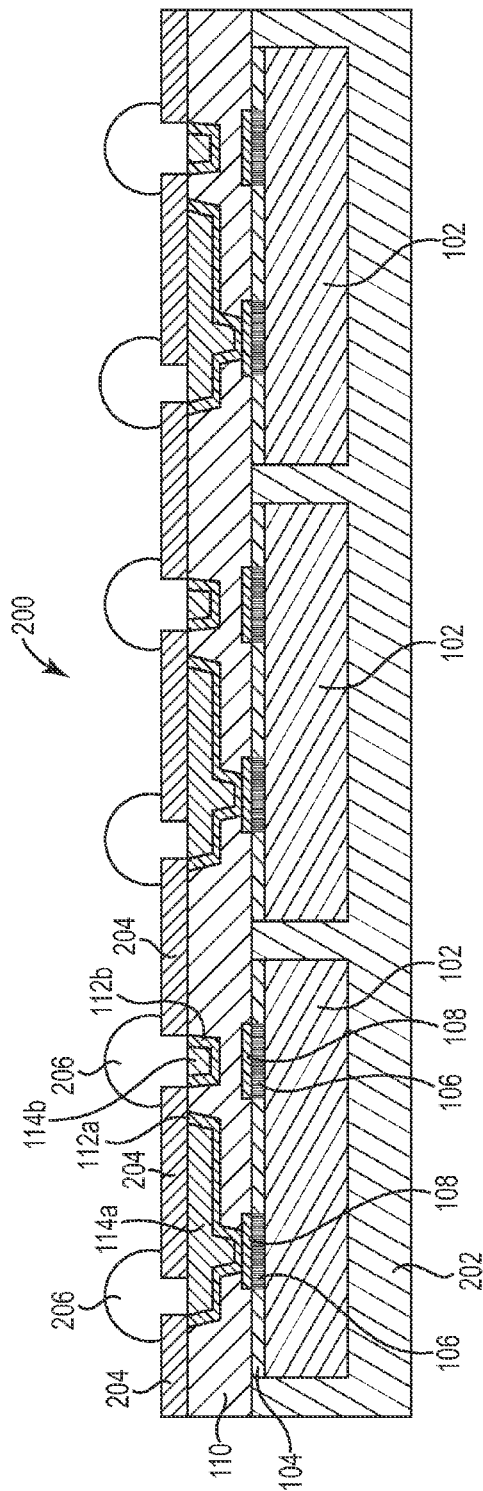
FIG. 10A illustrates a cross-sectional view of one embodiment of an embedded wafer level ball grid array (eWLB) wafer.
Figure 10B:
FIG. 10B illustrates a top view of one embodiment of an eWLB wafer.

FIG. 10A illustrates a cross-sectional view and FIG. 10B illustrates a top view of one embodiment of an embedded wafer level ball grid array (eWLB) wafer 200. The eWLB wafer 200 includes a plurality of semiconductor devices 222. Each semiconductor device 222 includes a semiconductor die 102, a dielectric layer 104, chip terminal 106, pad metal 108, dielectric material 110, seed layer 112a and 112b, and metal layer 114a and 114b as similarly described and illustrated with reference to FIG. 1. In addition, each semiconductor device 222 includes solder stop 204 and solder balls 206. Each solder ball 206 contacts metal layer 114a or 114b. In other embodiments, solder balls 206 are replaced with other suitable solderable material elements, such as solder semiballs, thin layers of solder, or an Organic Surface Protection (OSP) material.

Figure 11:
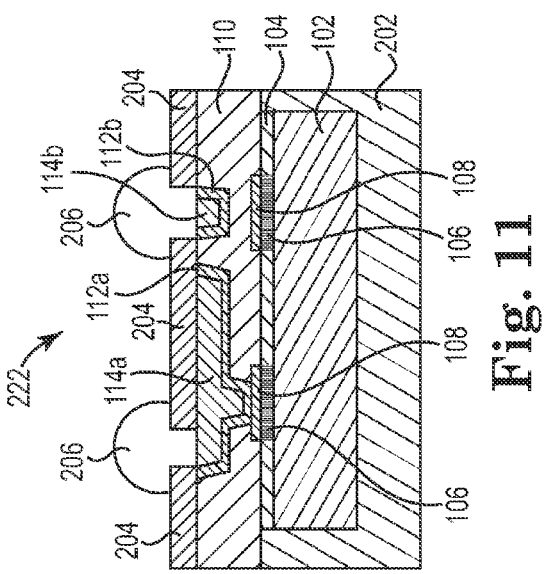
FIG. 11 illustrates a cross-sectional view of one embodiment of a singulated component from an eWLB wafer.

The sidewalls and optionally the bottom of each semiconductor die 102 are encased in a mold compound, which forms the base structure for eWLB wafer 200. Metal layers 114a and 114b are formed using a damascene plating process similar to the process previously described and illustrated with reference to FIGS. 2-9. After completing the fabrication of semiconductor devices 222 within eWLB wafer 200, the eWLB wafer is divided to provide singulated components 222 as illustrated in FIG. 11. In other embodiments, semiconductor chip 102 represents more than one chip (i.e., multi-chip) and/or passives and/or MEMS.

Figure 12:
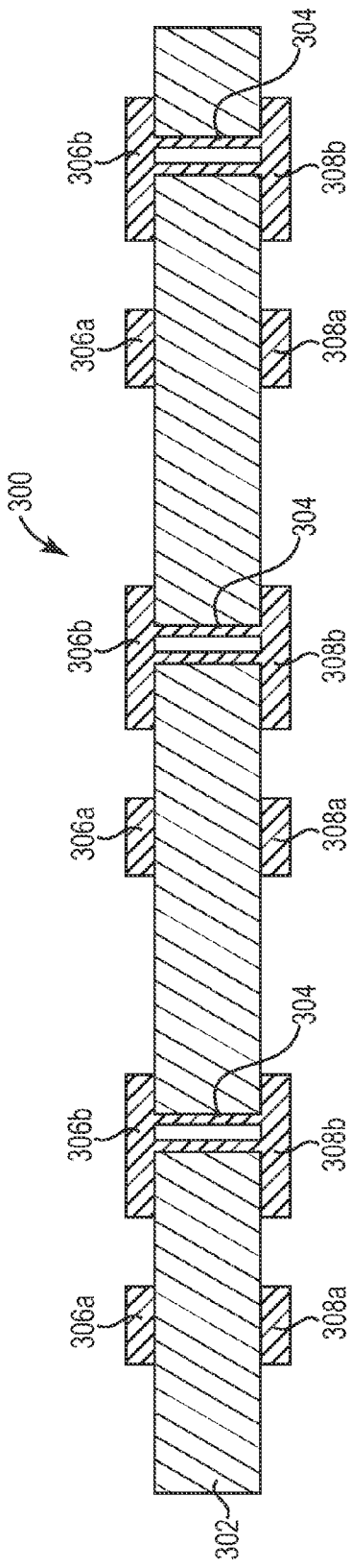
FIG. 12 illustrates a cross-sectional view of one embodiment of a laminate substrate.

FIG. 12 illustrates a cross-sectional view of one embodiment of a laminate substrate 300. Laminate substrate 300 includes a substrate core 302, a structured metal layer 306a and 306b (collectively referred to as structured metal layer 306), plated through holes 304, and structured metal layer 308a and 308b (collectively referred to structured metal layer 308). Structured metal layer 306 is formed on a first side of substrate core 302 and structured metal layer 308 is formed on a second side of substrate core 302. Plated through holes electrically couple structured metal layer 306b to structured metal layer 308b. In one embodiment, substrate core 302 is flexible.

Figure 13:
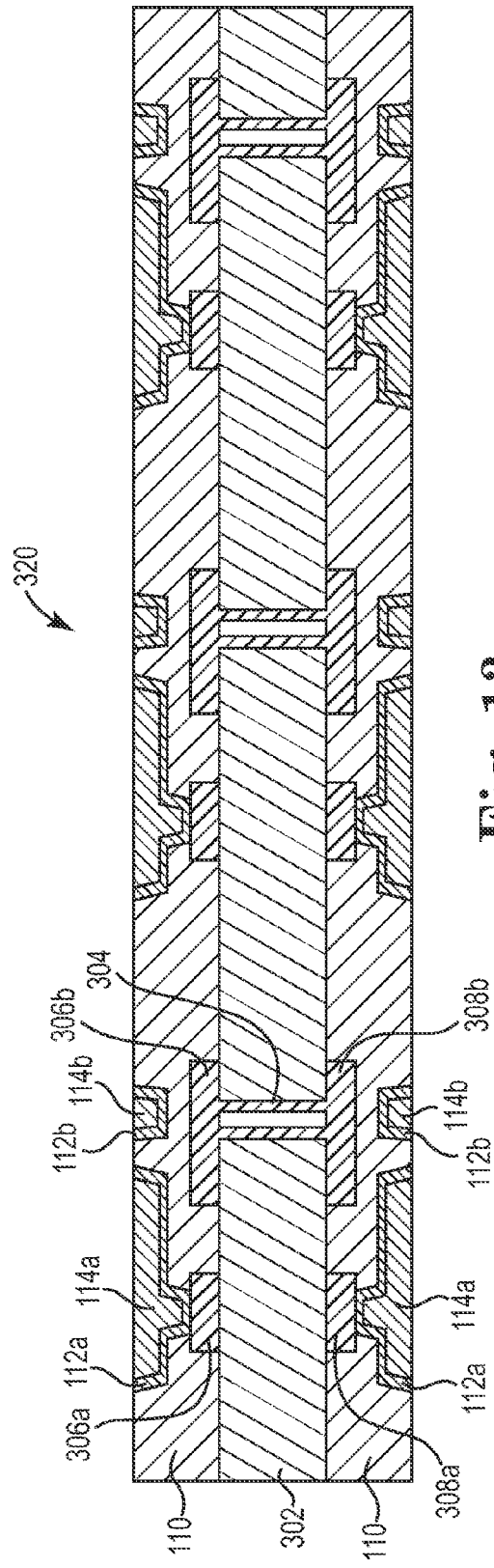
FIG. 13 illustrates a cross-sectional view of one embodiment of the laminate substrate after a damascene plating process.

FIG. 13 illustrates a cross-sectional view of one embodiment of laminate substrate 320 after a damascene plating process. In one embodiment, a process similar to the process previously described and illustrated with reference to FIGS. 2-9 is performed on both sides of laminate substrate 300 to provide dielectric material 110, seed layers 112a and 112b, and metal layers 114a and 114b. Metal layers 114a are electrically coupled to structured metal layer 306a and structured metal layer 308a through seed layer 112a. In other embodiments, a process similar to the process previously described and illustrated with reference to FIGS. 2-9 is performed on only one side of laminate substrate 300.

Figure 14:
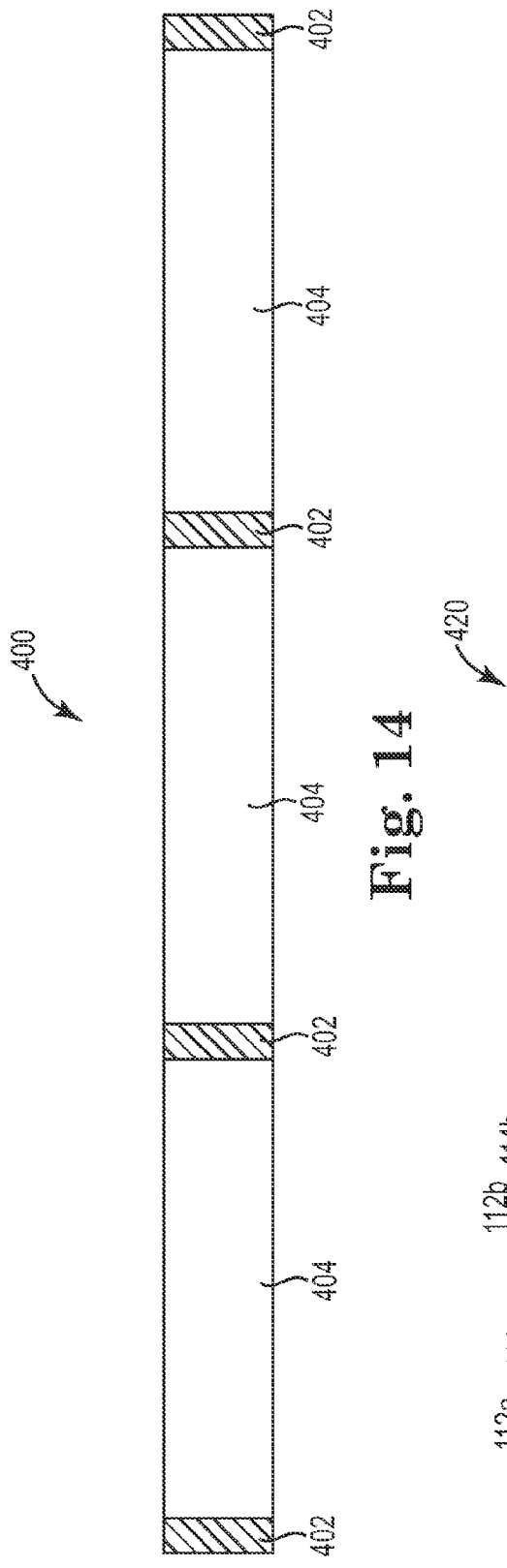
FIG. 14 illustrates a cross-sectional view of one embodiment of a laminate substrate with cavities for receiving embedded dies.

FIG. 14 illustrates a cross-sectional view of one embodiment of a laminate substrate 400 with cavities for receiving embedded dies. Laminate substrate 400 includes a substrate core 402 including cavities 404 for receiving dies.

Figure 15:
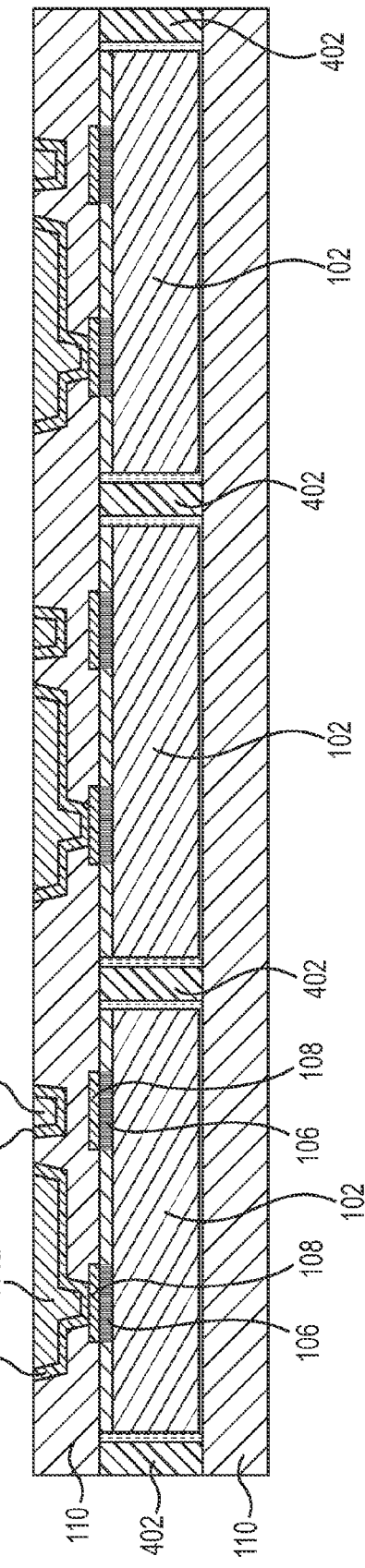
FIG. 15 illustrates a cross-sectional view of one embodiment of the laminate substrate after receiving the embedded dies and after a damascene plating process.

FIG. 15 illustrates a cross-sectional view of one embodiment of laminate substrate 420 after receiving the dies 102 and after a damascene plating process. Semiconductor dies 102 are embedded into cavities 404 of laminate substrate 400. Then, a process similar to the process previously described and illustrated with reference to FIGS. 2-9 is performed on one or both sides of laminate substrate 400 to provide dielectric material 110, seed layers 112a and 112b, and metal layers 114a and 114b. Metal layers 114a are electrically coupled to pad metal 108 through seed layer 112a. In another embodiment, semiconductor chip 102 is mounted without any cavity on top of substrate 402 and the chip is embedded into dielectric material 110.

The following FIGS. 16-24 illustrate other embodiments for fabricating semiconductor device 100 previously described and illustrated with reference to FIG. 1 using a damascene plating process.

Figure 16:
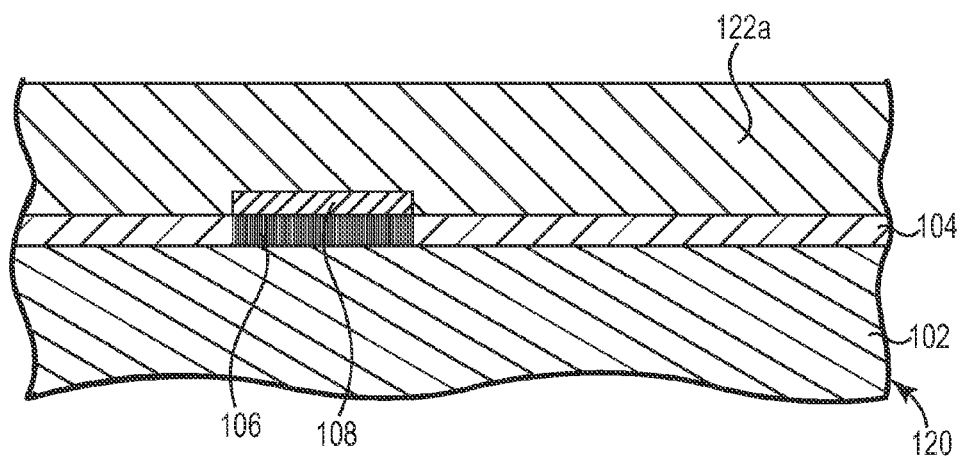
FIG. 16 illustrates a cross-sectional view of one embodiment of a preprocessed structure and a dielectric material layer.

FIG. 16 illustrates a cross-sectional view of one embodiment of a preprocessed structure 120 and a dielectric material layer 122a. A dielectric material, such as Ajinemoto Build-up Film (ABF) or other suitable dielectric material is applied over preprocessed structure 120 previously described and illustrated with reference to FIG. 2 to provide dielectric material layer 122a. In one embodiment, dielectric material layer 122a is selected to be suitable for laser ablation. In one embodiment, dielectric material layer 122a is applied in sheet form. In another embodiment, dielectric material layer 122a is applied using spin-on, spray-on, curtain coating, or other suitable deposition technique. Dielectric material layer 122a is applied to a thickness suitable for embedding metal traces and via contacts within the dielectric material layer.

Figure 17:
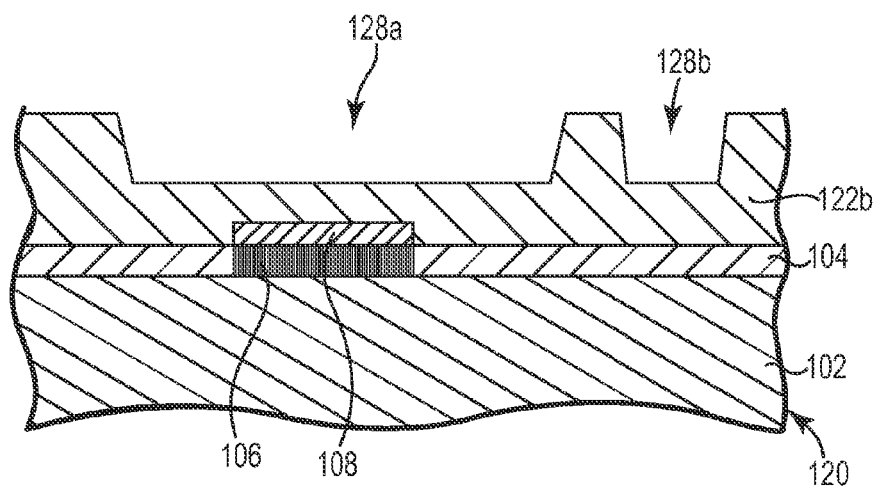
FIG. 17 illustrates a cross-sectional view of one embodiment of the preprocessed structure and the dielectric material layer after a first laser ablation process.

FIG. 17 illustrates a cross-sectional view of one embodiment of preprocessed structure 120 and dielectric material layer 122b after a first laser ablation process. Trace shapes 128a and 128b are formed in dielectric material layer 122a by laser ablation using a first mask or pattern to provide dielectric material layer 122b. For the ablation process, a laser having a suitable wavelength, pulse length, and power is selected based on the material used for dielectric material layer 122a.

Figure 18:
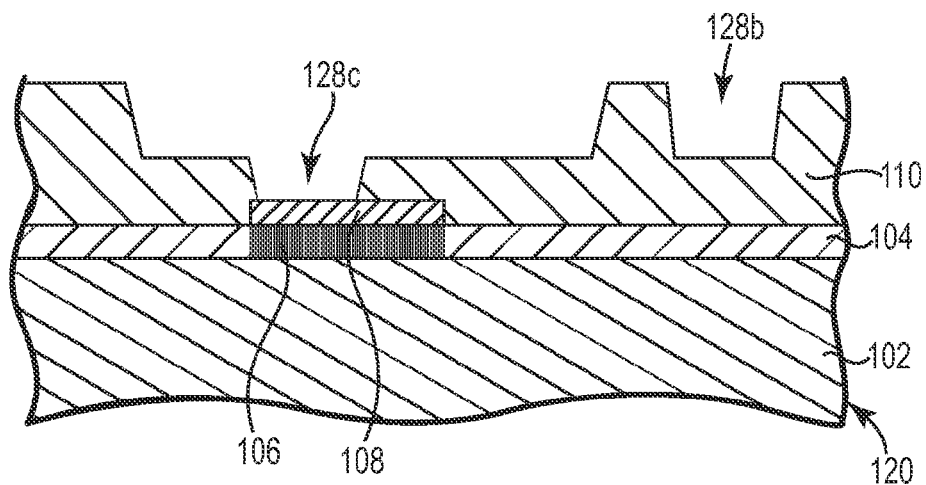
FIG. 18 illustrates a cross-sectional view of one embodiment of the preprocessed structure and the dielectric material layer after a second laser ablation process.

FIG. 18 illustrates a cross-sectional view of one embodiment of preprocessed structure 120 and dielectric material layer 110 after a second laser ablation process. Via shapes 128c are formed into dielectric material layer 122b by laser ablation using a second mask or pattern to provide dielectric material layer 110 exposing at least a portion of pad metal 108.

In one embodiment, if chip terminal 106 and pad metal 108 are sufficiently thick (e.g., the chip terminal 106 provides a copper pillar), the ablation of via structure 128c may be omitted. In this case, the traces 128a and 128b are ablated to a depth that exposes the top surface of pad metal 108. Thus, the additional laser ablation step to form via shapes 128c is eliminated. In other embodiments, structures 128 are formed using litho-processing or other suitable processes.

Figure 19:
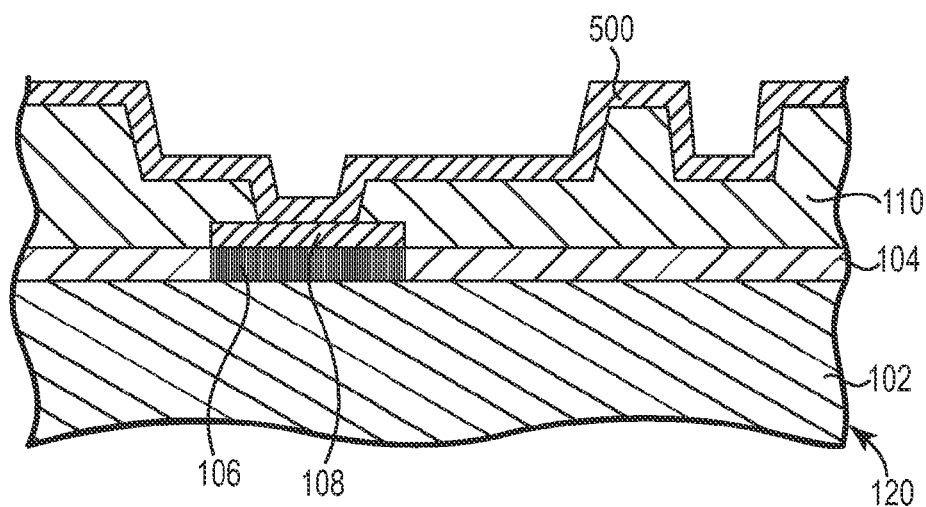
FIG. 19 illustrates a cross-sectional view of one embodiment of the preprocessed structure, the dielectric material layer, and a seed layer.

FIG. 19 illustrates a cross-sectional view of one embodiment of preprocessed structure 120, dielectric material layer 100, and a seed layer 500. Copper (Cu), gold (Au), aluminum (Al), nickel (Ni), palladium (Pd), NiPd, electrically conductive polymer ink, ink with metallic nanoparticles, stacked layers of two or more of the above, or another suitable material is applied over exposed portions of dielectric material layer 110 and pad metal 108 to provide seed layer 500. In one embodiment, seed layer 500 is applied using an electroless deposition, a sputter deposition, a printing process, or another suitable process.

Figure 20:
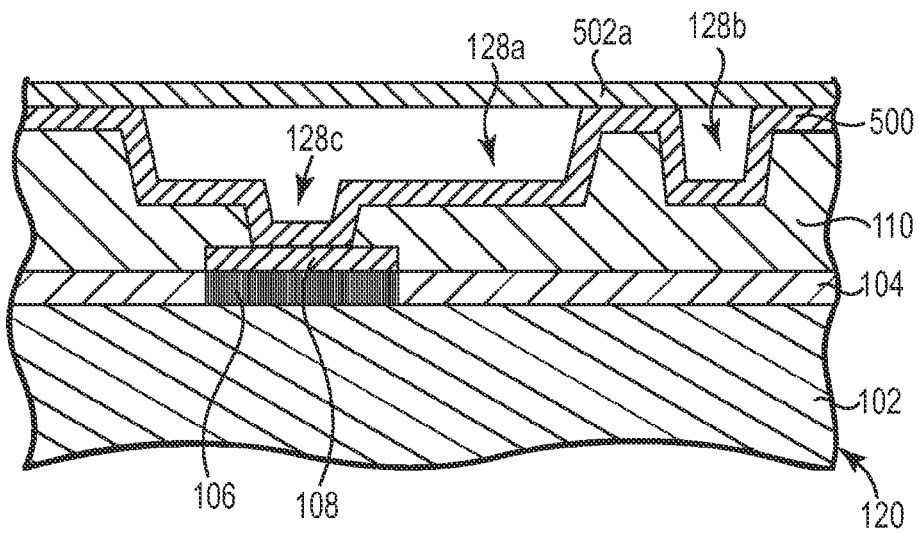
FIG. 20 illustrates a cross-sectional view of one embodiment of the preprocessed structure, the dielectric material layer, the seed layer, and a foil or film layer.

FIG. 20 illustrates a cross-sectional view of one embodiment of preprocessed structure 120, dielectric material layer 110, seed layer 500, and a foil or film layer 502a. A foil or film is applied over the upper planar portion of seed layer 500 to provide film layer 502a. Film layer 502a extends over the top of trace shapes 128a and 128b. In one embodiment, film layer 502a is applied using a lamination process or a vacuum lamination process. A small indentation of film layer 502a into trace shapes 128a and 128b will not have a relevant impact on the process result. In another embodiment, trace shapes 128a and 128b and via shapes 128c are filled with a sacrificial material prior to the application of film layer 502a. This sacrificial material is then removed after the opening of film layer 502a in a later process step, which is illustrated and described with reference to FIG. 21.

Figure 21:
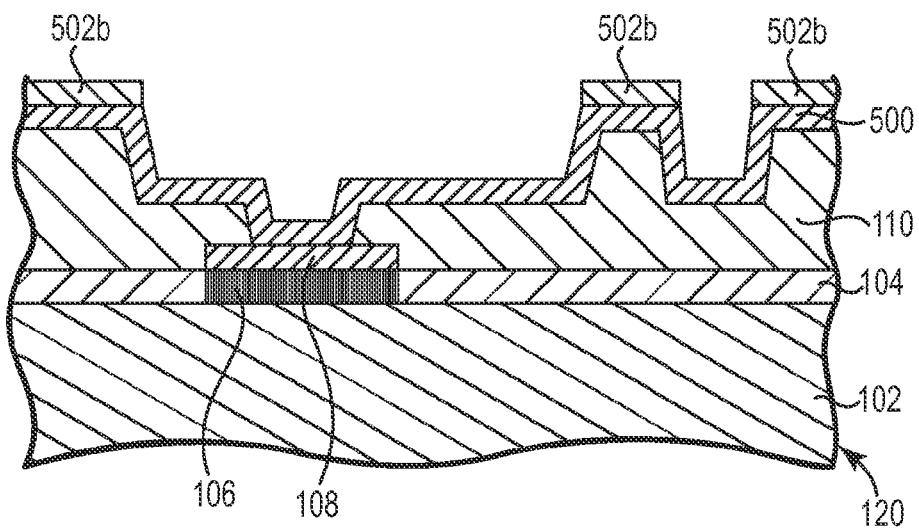
FIG. 21 illustrates a cross-sectional view of one embodiment of the preprocessed structure, the dielectric material layer, the seed layer, and the film layer after removing a portion of the film layer.

FIG. 21 illustrates a cross-sectional view of one embodiment of preprocessed structure 120, dielectric material layer 110, seed layer 500, and film layer 502b after removing a portion of the film layer 502a. Using a self-aligned process, the portions of film layer 502a contacting seed layer 500 are modified to provide film layer 502b. The unmodified portions of film layer 502a are then removed leaving film layer 502b. The unmodified portions of film layer 502a are removed using a resist stripping process or another suitable process.

In one embodiment, the portions of film layer 502a contacting seed layer 500 are modified by a chemical reaction between seed layer 500 and film layer 502a. For example, a copper seed layer can act as a catalyst (i.e., a starter for the chemical reaction in film layer 502a or as a curing agent (i.e., the copper becomes a part of a polymer molecule). In one embodiment, the opposite chemical principal is applied (i.e., the copper acts as an inhibitor for the chemical reaction). In this embodiment, "positive" and "negative" resists could be designed. In other embodiments, where seed layer 500 includes Ni, NiPd, Pd, Au, Al, electrically conductive polymer ink, ink with metallic nanoparticles, or stacked layers of two or more of the above, the uppermost part of the seed layer provides an interaction layer with film layer 502a.

In another embodiment, the portions of film layer 502a contacting seed layer 500 are modified by a photoreaction within film layer 502a induced by electromagnetic radiation. In one embodiment, film layer 502a is exposed using a maskless exposure (e.g., a floodlight) where only the portions of film layer 502a that are in direct contact with seed layer 500 receive enough energy for the photoreaction. In another embodiment, film layer 502a is scanned in rows or in an array matrix with energetic laser light. A photoreaction is initiated only in the portions of film layer 502a that are in direct contact with seed layer 500. In another embodiment, the portions of film layer 502a contacting seed layer 500 are modified by a combination of a chemical reaction and a photoreaction between seed layer 500 and film layer 502a.

In another embodiment, film layer 502a is excluded and film layer 502b is provided in the form of a reaction layer. In one embodiment, a reaction layer is applied to the upper planer surface of seed layer 500. The reaction layer is applied using a roller, a pad printing process, or other suitable process. The tool (i.e., the roller or pad) used to apply the reaction layer has a thin film of the reaction material on its surface that is transferred to the upper planer surface of seed layer 500. In another embodiment, the reaction layer is first applied to a film sheet, and then the reaction layer is transferred to the upper planer surface of seed layer 500. The intermediate film sheet provides the additional advantage that the hardness of the film sheet can be adjusted to optimize the transfer characteristics. In addition, by using an intermediate film sheet, tool wear out that could occur with a roller application is avoided. In one embodiment, the reaction layer is subjected to electromagnetic radiation, either infrared or ultraviolet, to provide film layer 502b.

Figure 22:
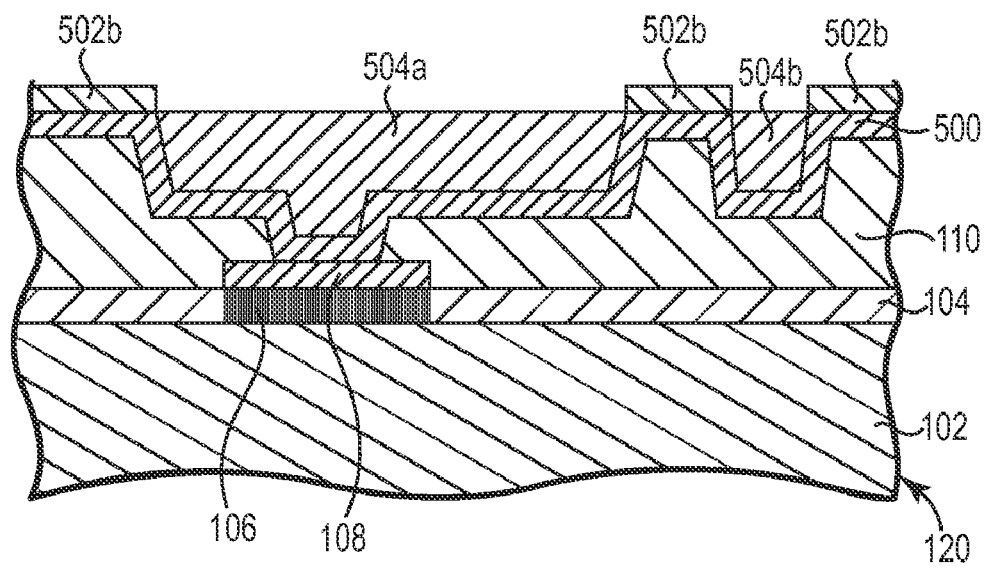
FIG. 22 illustrates a cross-sectional view of one embodiment of the preprocessed structure, the dielectric material layer, the seed layer, the film layer, and a metal layer.

FIG. 22 illustrates a cross-sectional view of one embodiment of preprocessed structure 120, dielectric material layer 110, seed layer 500, film layer 502b, and a metal layer 504a and 504b (collectively referred to as metal layer 504). An electroplating process is used to fill the trace and via structures with Cu or other suitable metal to provide metal layer 504. Where film layer 502b covers seed layer 500 and dielectric material layer 110, there is no deposition of metal layer 504. This plating process is much faster than the typical damascene plating process since this process fills the trace and via structures without overplating and eliminates the difficult to control backetch process.

Figure 23:
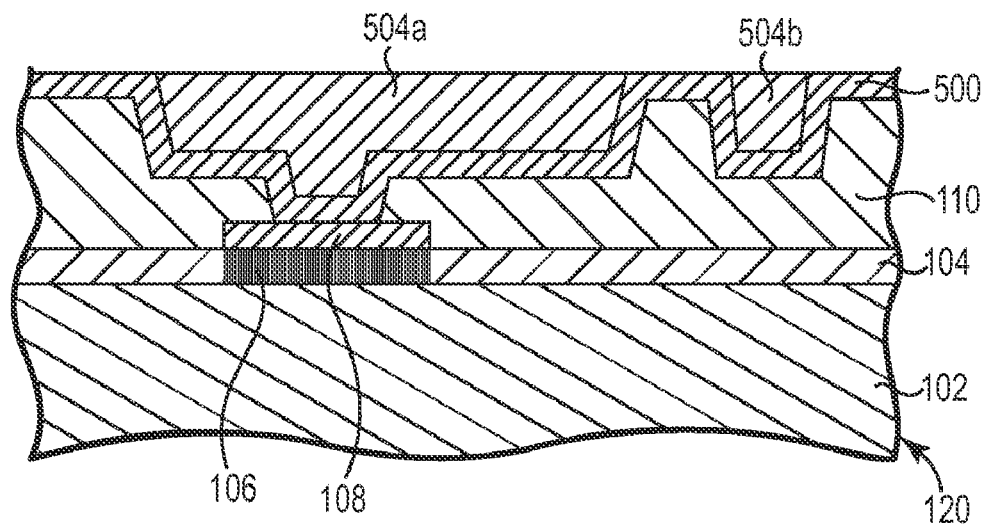
FIG. 23 illustrates a cross-sectional view of one embodiment of the preprocessed structure, the dielectric material layer, the seed layer, and the metal layer after removing the film layer.

FIG. 23 illustrates a cross-sectional view of one embodiment of preprocessed structure 120, dielectric material layer 110, seed layer 500, and metal layer 504 after removing film layer 502b. Film layer 502b is removed via a chemical stripping process, plasma etching, plasma ashing, laser ablation, or other suitable technique to expose portions of seed layer 500.

Figure 24:
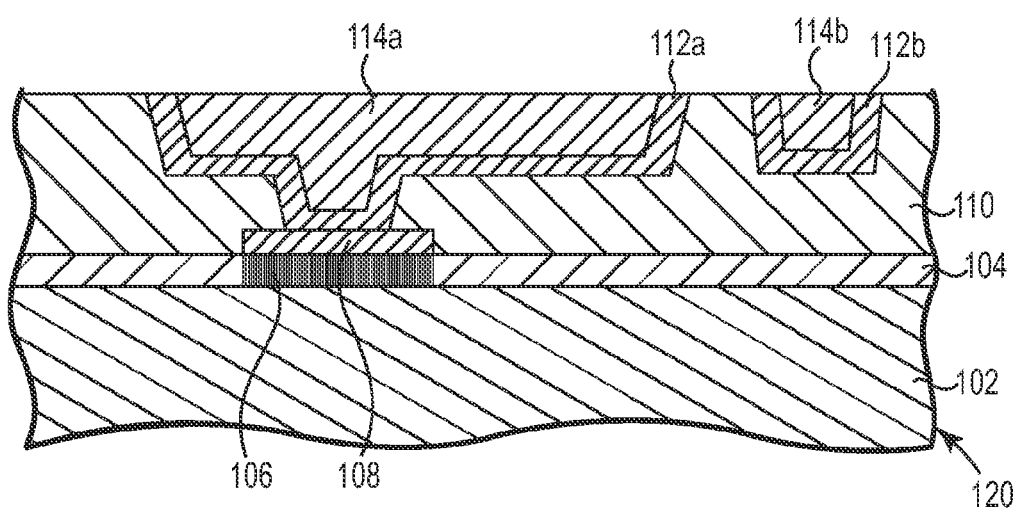
FIG. 24 illustrates a cross-sectional view of one embodiment of the preprocessed structure, the dielectric material layer, the seed layer, and the metal layer after removing a portion of the seed layer.

FIG. 24 illustrates a cross-sectional view of one embodiment of preprocessed structure 120, dielectric material layer 110, seed layer 112a and 112b, and metal layer 114a and 114b after removing a portion of seed layer 500. An exposed portion of seed layer 500 is removed by etching, plasma-etching, laser ablation, polishing, or other suitable technique to provide seed layer 112a and 112b and semiconductor device 100 previously described and illustrated with reference to FIG. 1.

In one embodiment, the process previously described and illustrated with reference to FIGS. 16-24 is used to fabricate metal layers 114a and 114b of eWLB wafer 200 previously described and illustrated with reference to FIGS. 10A and 10B. In another embodiment, the process previously described and illustrated with reference to FIGS. 16-24 is used to fabricate metal layers 114a and 114b of laminate substrate 320 previously described and illustrated with reference to FIG. 13 or laminate substrate 420 previously described and illustrated with reference to FIG. 15.

Embodiments provide semiconductor devices (e.g., eWLB based devices, laminate substrate based devices, flexible substrate based devices, or other suitable devices) fabricated using a damascene plating process. Embodiments of the damascene plating process utilize an inert layer or a film layer that eliminates the need for overplating and a difficult to control backetch process. Therefore, embodiments of the invention substantially increase the speed of the fabrication process and reduce the cost of the fabrication process compared to typical fabrication processes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a device, the method comprising:
    providing a substrate comprising at least one contact;
    applying a dielectric layer over the substrate;
    applying a first seed layer over the dielectric layer;
    applying an inert layer over the seed layer;
    structuring the inert layer, the first seed layer, and the dielectric layer to expose at least a portion of the contact;
    applying a second seed layer over exposed portions of the structured dielectric layer and the contact such that the second seed layer makes electrical contact with the structured first seed layer; and
    electroplating a metal on the second seed layer.

2. The method of claim 1, further comprising:
    removing the structured inert layer and the structured first seed layer after electroplating.

3. The method of claim 1, wherein structuring the inert layer, the first seed layer, and the dielectric layer comprises laser ablating the inert layer, the first seed layer, and the dielectric layer.

4. The method of claim 1, wherein applying the first seed layer comprises applying a first seed layer comprising copper.

5. The method of claim 1, wherein applying the second seed layer comprises applying a second seed layer comprising palladium.

6. The method of claim 1, wherein applying the inert layer comprises applying an inert layer comprising one of polytetrafluoroethylene (PTFE), polyvinylidene fluoride (PVDF), polyaryletheretherketone (PEEK), perfluoroalkoxy polymer (PFA), parylene, polyethylene, and polypropylene.

7. A method for fabricating a device, the method comprising:
    providing a substrate comprising at least one contact;
    applying a dielectric layer over the substrate;
    structuring the dielectric layer to provide at least one opening exposing at least a portion of the contact;
    applying a seed layer over the structured dielectric layer and the exposed portion of the contact;
    applying a film layer over the seed layer such that the film layer contacts only an upper planar surface of the seed layer;
    modifying portions of the film layer where the film layer contacts the seed layer;
    removing any unmodified portions of the film layer; and
    electroplating a metal on the exposed portions of the seed layer.

8. The method of claim 7, further comprising:
    filling the at least one opening with a sacrificial material prior to applying the film layer; and
    removing the sacrificial material prior to electroplating.

9. The method of claim 7, wherein modifying portions of the film layer comprises modifying portions of the film layer via a chemical reaction between the film layer and the seed layer.

10. The method of claim 7, wherein modifying portions of the film layer comprises modifying portions of the film layer by exposing the film layer to electromagnetic radiation to induce a photoreaction in the portions of the film layer contacting the seed layer.

11. The method of claim 7, wherein applying the film layer comprises laminating the film layer to the upper planar surface of the seed layer.

12. The method of claim 7, wherein applying the film layer comprises applying the film layer via one of a roller and a pad printing process.

13. The method of claim 7, wherein applying the film layer comprises applying a reactive material to a film sheet and transferring the reactive material from the film sheet to the upper planar surface of the seed layer to provide the film layer.

14. The method of claim 7, further comprising:
    removing the modified portions of the film layer after electroplating.

15. The method of claim 7, wherein structuring the dielectric layer comprises laser ablating the dielectric layer.

16. The method of claim 7, wherein applying the seed layer comprises applying a seed layer comprising one of copper, palladium, nickel, aluminum, gold, electrically conductive polymer ink, and ink with metallic nanoparticles.

* * * * *